United States Patent [19]

Dorsman

[11] 3,777,152

[45] Dec. 4, 1973

[54] PHOTOTRANSISTOR BUFFER CIRCUIT

[75] Inventor: Adrian K. Dorsman, Bellflower, Calif.

[73] Assignee: North American Rockwell Corporation, El Segundo, Calif.

[22] Filed: May 22, 1972

[21] Appl. No.: 255,507

[52] U.S. Cl. ............... 250/206, 250/219 D, 328/164

[51] Int. Cl. ...... G01n 21/30, H03b 1/00, H03k 5/00

[58] Field of Search .................. 250/219 D, 231 SE, 250/206, 219 DC, 219 DD; 328/164

[56] References Cited

UNITED STATES PATENTS 3,631,250 12/1971 Van Buskirk .................. 250/219 D

*Primary Examiner*—James W. Lawrence
*Assistant Examiner*—T. N. Grigsby
*Attorney*—L. Lee Humphries et al.

[57] ABSTRACT

A phototransistor output amplifier circuit which provides noise rejection through positive feedback and generates complementary output pulses.

10 Claims, 4 Drawing Figures

PHOTOTRANSISTOR BUFFER CIRCUIT

BACKGROUND

There are many uses for phototransistor circuits, such as encoders which are utilized with rotating shafts or the like. However, phototransistor circuits generally have very low signal level outputs. The phototransistor type of circuit is frequently used to detect the rotation or speed of rotation of a shaft or even linear motion of other moving devices. However, since phototransistor detector circuits usually have very low output signal levels, signal-to-noise ratios are low and many obvious and inherent problems are encountered. In addition, this low level output signal usually requires a short output line wherein it is difficult to obtain a useful signal from such a phototransistor detector circuit. In the past amplifier circuits for use with phototransistor circuits have been quite expensive.

SUMMARY OF THE INVENTION

A low cost circuit for amplifying the output of a phototransistor detector circuit which includes a plurality of inverter buffer circuit devices. In one embodiment, the inverter buffers are interconnected so that complementary output signals are supplied on a pair of output lines. A positive feedback network is utilized to provide noise rejection at the output signal.

Circuit embodiments are described wherein increased sensitivity of the circuit may be provided and wherein a further embodiment is shown which utilizes a plurality of circuits to operate on multiple phototransistor detector circuits.

DESCRIPTION OF PREFERRED EMBODIMENTS

Figure 1:
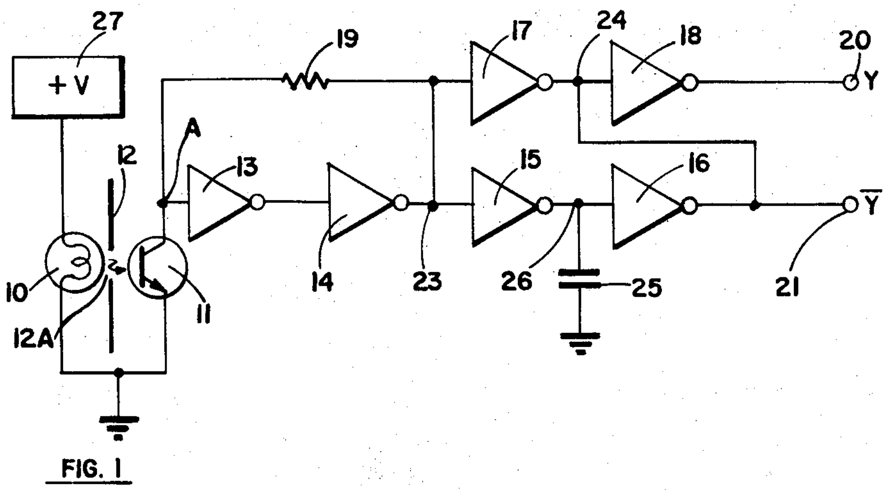
FIG. 1 is a schematic diagram of a preferred embodiment of the instant invention.

In the accompanying drawings, similar components are designated by similar reference numbers.

A suitable light source 10 is connected from a suitable potential source 27, for example +V volts, to a suitable reference potential, for example ground. In this embodiment, it is suggested that source 27 supply a DC voltage wherein light source 10 is continuously illuminated. Of course, in some applications, it may be desirable to have an AC source applied to light source 10 wherein the light source will be a flashing type source which will be coordinated and synchronized with a suitable screening apparatus. Light source 10 is disposed adjacent a suitable mask or shield 12 which includes an aperture 12A therein. It is suggested that mask 12 and light source 10 move relative one to the other. For example, mask 12 may be a rotating disc mounted on a shaft or the like, the rotation of which is intended to be detected. Conversely, of course, mask 12 may be stationary and light source 10 may be fastened on the apparatus which is to be monitored.

Phototransistor 11 has one electrode (e.g. the emitter) connected to the reference potential source noted previously, for example ground. The other electrode thereof is connected to the input of a first inverting buffer 13 (at circuit point A). The output of inverting buffer 13 is connected to the input of inverting buffer 14. The output of inverting buffer 14 is connected to the input of inverting buffer 15 via common junction 23. The output of inverting buffer 15 is connected via common junction 26 to the input of inverting buffer 16. In addition, capacitor 25 is connected between a suitable reference source such as ground and common junction 26. The output of the inverting buffer 16 is connected to output terminal 21 at which terminal the signal $\overline{Y}$ is produced. In addition, the output of inverting buffer 16 is connected to common junction 24 which is connected to the input of inverting buffer 18 and the output of inverting buffer 17. The output of inverting buffer 18 is connected to output terminal 20 at which terminal the signal Y is produced. The input of inverting buffer 17 is connected to common junction 23. Feedback resistor 19 is connected between terminal 23 (i.e. the output of inverting buffer 14) and the input of inverting buffer 13. Hereinafter, the inverting buffers will be termed "inverters."

Figure 2:
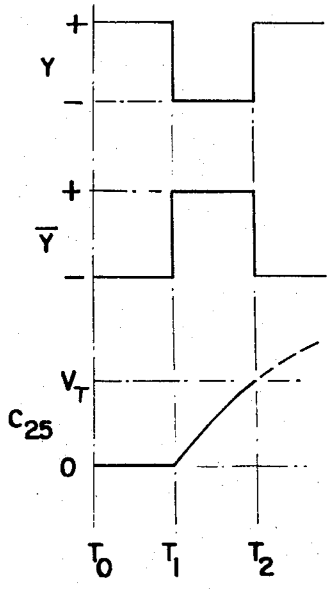
FIG. 2 is a timing diagram for signals produced by the circuit shown in FIG. 1.

In describing the operation of the circuit shown in FIG. 1, concurrent reference is made to FIG. 2. It is initially assumed that no radiation from source 10 impinges upon phototransistor 11 at time TO (FIG. 2). This condition may be due to the fact that mask 12 (not aperture 12A) is located intermediate the source and the phototransistor. However, without the application of radiation thereto, phototransistor 11 represents an extremely high impedance. This impedance is on the order of 10 M ohms. Consequently, the input of inverter 13 appears as a positive or true input signal to that inverter. That is, each of the inverting buffers (inverters) is a conventional circuit known in the art. The several inverters may be included in a single low cost, digital, integrated circuit wherein a relatively inexpensive circuit is provided. The circuits generally include reference and source potentials which are supplied thereto. For example, the several inverters may be referenced to source 27. However, these sources are omitted from the drawings in order to preserve clarity.

Inverter 13 operates upon this positive (or true) input signal to produce a negative (or false) output signal which is supplied to and inverted by inverter 14. Consequently, a positive output signal is supplied at terminal 23. This relatively positive signal is supplied to the inputs of inverters 15 and 17 which operate upon this signal and produce negative or false output signals at the output terminals thereof. The negative signal at terminal 24 produced at the output of inverter 17 is operated upon by inverter 18 whereby a positive output signal Y is produced thereby at terminal 20. Normally, inverter 16 would have also produced a positive output signal $\overline{Y}$ at output terminal 21. However, terminal 24 (i.e. the output of inverter 17) is "wire OR'd" to output terminal 21 whereby the output signal detected at terminal 21 is negative. Thus, the signals at terminals 21 and 20 are of opposite polarity or complementary.

When, subsequently, light passes from source 10 through aperture 12A of mask 12 to phototransistor 11 at time T1, the phototransistor begins to conduct and exhibit relatively low impedance. Thus, the input of inverter 13 is essentially clamped to the relatively negative level, i.e. ground potential or a false signal. Consequently, inverter 13 produces a positive output signal which is supplied to and inverted by inverter 14. Thus, a negative signal is applied at common junction 23. This signal is supplied to and inverted by inverters 15 and 17 whereby the output signal produced by inverter 17 becomes positive and the signal Y produced at output terminal 20 by inverter 18 becomes negative at time T1. In addition, the positive signal at common junction 24 is supplied to output terminal 21. Consequently, the signal levels at output terminals 20 and 21 have changed state.

Inverter 15 operates upon the signal at common junction 23 and attempts to produce a positive or true output signal. However, this signal is supplied across capacitor 25 which capacitor must charge through the pull-up resistor included in inverter 16 until the threshold or switching level of inverter 16 is achieved. Thus, the operation of inverter 16 is not altered until this switching level is achieved and inverter 16 continues to produce a positive output signal $\overline{Y}$ at terminal 21. When the switching level of inverter 16 is achieved, (i.e. capacitor 25 is charged to $V_T$) inverter 16 operates to produce a negative output signal at terminal 21 at time T2. However, this signal has been delayed relative to the application of the signal at common junction 23. When the $\overline{Y}$ signal at terminal 21 does switch to the negative level at time T2, this negative signal is supplied to common junction 24 at the input of inverter 18 whereby inverter 18 produces a positive output signal. At this point, i.e. time T2, the output signals Y and $\overline{Y}$ at terminals 20 and 21, respectively, have returned to the initial states or levels.

The pulse width of the pulse defined by the signal level changes between time periods T1 and T2, is a direct function of the value of the capacitance C of capacitor 25 and may typically be set from about 100 nanoseconds to approximately 10 microseconds. For these conditions, the capacitance of capacitor 25 will normally fall in the range of 100pfd to 0.01$\mu$fd.

Resistor 19 is connected from terminal 23 to terminal A or from the output of inverter 14 to the input of inverter 13. Resistor 19 operates as a positive feedback network. Through this positive feedback network, a predetermined hysteresis level is established for the circuit wherein low amplitude noise signals are rejected. This noise rejection permits an improved operating characteristic for the circuit.

Figure 3:
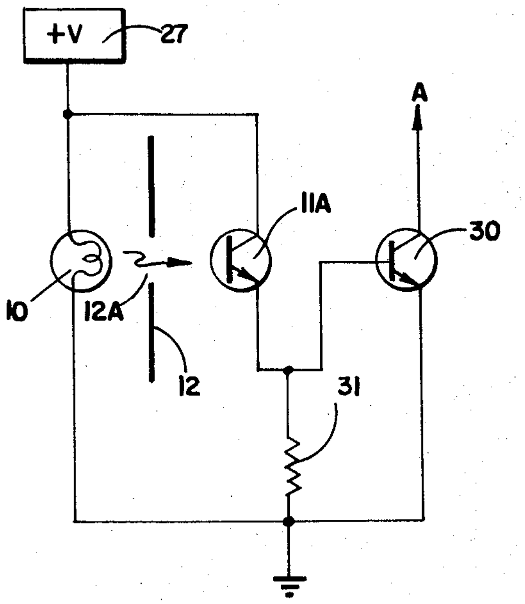
FIG. 3 is a schematic diagram of the portion of the circuit shown in FIG. 1 with an amplifier circuit for increased sensitivity of the overall circuit.

Referring now to FIG. 3, there is shown a modification of the circuit shown in FIG. 1. That is, light source 10 is connected between potential source 27 and ground. Mask 12 with aperture 12A therein is disposed adjacent to light source 10. The emitter electrode of phototransistor 11A (which is similar to phototransistor 11) is connected to ground potential via load resistor 31. However, in FIG. 3, the collector of transistor 11A is connected to source 27. Amplifier transistor 30 has the emitter thereof connected to ground and the base thereof connected to the emitter of transistor 11A wherein resistor 31 is connected across the base-emitter junction of transistor 30. The collector of transistor 30 is connected to terminal A shown in FIG. 1. The remainder of the circuit is similar to the circuit of FIG. 1.

The operation of the circuit modification shown in FIG. 3 is identical to the operation of the circuit shown in FIG. 1. However, the circuit shown in FIG. 3 permits amplification of the signal produced by phototransistor 11A due to radiation impinging thereon. That is, the signal generated across resistor 31 is amplified by transistor 30 connected in the common emitter mode. This signal is then supplied to terminal A and reference is then made to FIG. 1 for the operation of the remainder of the circuit.

Figure 4:
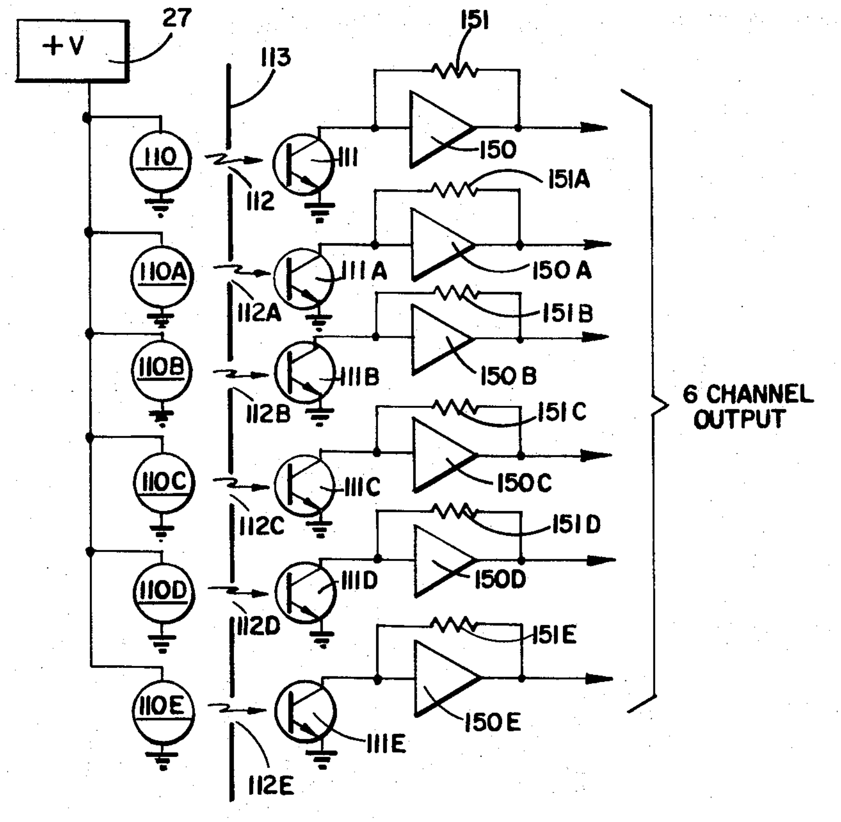
FIG. 4 is a schematic diagram of a multiple channel phototransistor buffer circuit.

Referring now to FIG. 4, there is shown a multiple channel phototransistor buffer circuit. In particular, there are shown six channels of circuitry each of which is identical to the others. Each channel includes a separate light source 110 through 110E. Each of the sources is connected between a suitable source 27 and a reference potential, e.g. ground. A multi-aperture mask 113 is disposed adjacent to the several light sources. Mask 113 includes a plurality of apertures 112 through 112E with one aperture associated with each of said light sources. Of course, other patterns of apertures and light sources can be provided. A plurality of phototransistors 111 through 111E is disposed to receive radiation through the aperture of mask 113 from a counterpart light source. The letter suffix (if any) for associated light sources and phototransistors is identical.

One electrode (for example the emitter electrode) of each of the phototransistors is connected to a suitable reference potential, for example ground. The other electrode of each phototransistor is connected to the input of a separate buffer circuit. The buffer circuits are designated 150–150E with the suffix corresponding to the suffix of the associated phototransistor. The output of each of the buffer circuits is connected to a suitable output terminal wherein a six channel output is provided. Feedback resistors 151 through 151E are connected from the output terminal to the input terminal of a buffer in accordance with the letter suffix of the reference numeral.

The operation of this circuit is similar to the circuit as shown and described supra. That is, when aperture 113 is properly disposed, radiation from light source 110 is transmitted through aperture 112 to phototransistor 111. This radiation reduces the impedance of the phototransistor wherein conduction therethrough occurs. The input of buffer 150 is thereby connected to ground and produces an output signal representative thereof. Of course, similar operation occurs in each of the other channels.

Moreover, when mask 113 is differently disposed, the mask blocks the radiation from light source 110 to phototransistor 111 wherein the impedance of phototransistor 111 is quite high. At this point, a relatively high signal is supplied to the input of buffer 150 and an output signal is produced at the output channels as a function thereof. Again, feedback resistor 151 (and counterpart feedback resistors) produce a hysteresis band relative to the buffer operation wherein low level noise-type input signals are suppressed and do not affect operation of the circuit significantly.

In the circuit shown in FIG. 4, the individual buffers must be non-inverting. Non-inverting buffers are depicted. Of course, each non-inverting buffer may comprise a pair of inverting buffers connected in series. Again, this circuit utilizes a "hex-buffer" low cost digital integrated circuit to produce a relatively low cost phototransistor buffer circuit. Typically, if desired, the output signals at the output terminals of the several buffers of FIG. 4 may be connected to common junction 23 in circuits similar to those shown in FIG. 1 to produce the complementary output signals.

Thus, there has been shown and described a preferred embodiment of a phototransistor buffer circuit. This circuit operates upon a radiation signal which is selectively emitted or transmitted through an aperture in a mask. The circuit operates upon this radiation signal and produces a pair of complementary output signals on a pair of output lines. The complementary signals are of a fixed, uniform time duration. The circuit shown and described is a preferred embodiment of the instant invention. Those skilled in the art may be able to modify this circuit within the doctrine of equivalents to provide circuits which operate in a functionally similar manner. However, the description and drawings above are illustrative only and are not intended to be limitative. Therefore, any modifications made to the instant circuit, within the purview of the inventive concepts, is intended to be included within this description.

Having thus described a preferred embodiment of the invention, what is claimed is:

1. A circuit comprising:

energy source means, energy responsive means for producing output signals representative of receipt of energy from said energy source means, amplifier means connected to said energy responsive means for amplifying output signals produced by said energy responsive means, a first pair of series connected inverter means connected to receive signals from said amplifier means, and a second pair of series connected inverter means connected to receive signals from said amplifier means, the output of said second pair of series connected inverters connected to the series connection between the inverter means of said first pair of series connected inverter means.

2. The circuit recited in claim 1 wherein said amplifier means includes non-inverting network means.

3. The circuit recited in claim 2 wherein said non-inverting means comprises an even number of inverting means connected in series.

4. The circuit recited in claim 1 including storage means connected to the series connection between the inverter means of said second pair of inverter means, said storage means selectively controlling the operation of at least one of said inverter means of said second pair of inverter means.

5. The circuit recited in claim 4 wherein said energy storage means includes capacitor means.

6. The circuit recited in claim 1 including second amplifier means connected between said energy responsive means and the first mentioned amplifier means.

7. The circuit recited in claim 6 wherein said second amplifier means includes at least one transistor amplifier.

8. The circuit recited in claim 1 wherein said energy source means comprises energy radiating means.

9. The circuit recited in claim 8 wherein said energy radiating means comprises a light source, and said energy responsive means comprises a phototransistor.

10. The circuit recited in claim 1 including feedback means connected between the output and the input of said amplifier means for establishing hysteresis operating characteristic of said amplifier means whereby noise signals are effectively eliminated.

* * * * *